United States Patent [19]

Salisbury et al.

[11] Patent Number: 5,552,607

[45] Date of Patent: Sep. 3, 1996

[54] IMAGER DEVICE WITH INTEGRAL ADDRESS LINE REPAIR SEGMENTS

[75] Inventors: Roger S. Salisbury, Niskayuna; Ching-Yeu Wei; Robert F. Kwasnick, both of Schenectady, all of N.Y.

[73] Assignee: General Electric Company, Schenectady, N.Y.

[21] Appl. No.: 493,021

[22] Filed: Jun. 21, 1995

[51] Int. Cl.$^6$ .......................... H01L 25/00; H01L 27/10; H01L 27/13

[52] U.S. Cl. .................... 250/370.09; 250/370.01; 250/370.08; 250/338.4; 250/332; 250/208.1; 257/448; 257/457; 257/760; 257/776; 257/913

[58] Field of Search ................... 250/370.09, 370.01, 250/370.08, 338.4, 332, 208.1; 257/448, 457, 760, 776, 913

[56] References Cited

U.S. PATENT DOCUMENTS

| | | | |
|---|---|---|---|
| 4,688,896 | 8/1987 | Castleberry | 350/333 |
| 4,804,953 | 2/1989 | Castleberry | 340/784 |
| 5,049,969 | 9/1991 | Orbach et al. | 257/776 |
| 5,062,690 | 11/1991 | Whetten | 359/59 |
| 5,303,074 | 4/1994 | Salisbury | 359/59 |

OTHER PUBLICATIONS

Application entitled, "Method of Locating Common Electrode Shorts in an Imager Assembly," Ser. No. 08/161,037, filed Dec. 3, 1993.

Application entitled, "Post–Fabrication Repair Structure and Method for Thin Film Imager Devices," Ser. No. 08/280,970, Jul. 27, 1994.

Application entitled, "Repair Line Structure for Thin Film Electronic Devices," Ser. No. 08/169,290, filed Dec. 20, 1993.

Application entitled, "Address Line Repair Structure and Method for Thin Film Imager Devices," Ser. No. 08/436,681, May 8, 1995.

Application entitled, "Method of Isolating Vertical Shorts in an Electronic Array," Ser. No. 08/115,082, Sep. 2, 1993.

*Primary Examiner*—Constantine Hannaher
*Assistant Examiner*—Virgil Orlando Tyler
*Attorney, Agent, or Firm*—Donald S. Ingraham

[57] ABSTRACT

An imager array data line repair structure for use in high performance imager arrays includes a first and a second plurality of address lines that are disposed in respective layers with an intermediate layer having at least one insulative material disposed therebetween. The imager device further includes at least one integral address line repair segment that is disposed in the same layer as the first address lines and that is electrically isolated from the first address lines; the integral address line repair segment is disposed so as to underlie a repair portion of the second address line, with the intermediate layer disposed therebetween, and has a width substantially the same as the overlying second address line. In initial fabrication, the integral address line repair segment is electrically isolated from the overlying repair segment of the second address line; in the event a repair has been effected, the repair portion of the second address line is electrically coupled to the underlying integral address line repair segment through laser welds.

13 Claims, 2 Drawing Sheets

IMAGER DEVICE WITH INTEGRAL ADDRESS LINE REPAIR SEGMENTS

BACKGROUND OF THE INVENTION

This invention relates generally to large area solid state imager devices and specifically to address line repair structures for large area imager devices.

Solid state imaging devices can be used for detection of incident radiation. Such imager devices typically comprise an array of pixels with an associated matrix of rows and columns of address lines to electrically access each pixel. Each pixel has a photosensor and a switching transistor, such as a thin film transistor (TFT), the gate of which is coupled to a scan line and the source of which (or alternatively, the drain) is coupled to a data line. These address lines are used to read the signal from respective ones of pixel photosensors.

The various components in an imager device are formed in layers on a substrate such that, after assembly, repair of electrical defects is time consuming and may not succeed. Especially for pixel address lines that are sandwiched in the imager structure, electrical opens in such lines can lead to long portions of the address lines that are not functional. For example, one critical conductive component sandwiched within the completed structure are data lines, which are used to read out the signal from respective pixels. In some high performance arrays, such as are used in medical diagnostic imaging, the data line may be intentionally severed in the middle of the imager to improve imager performance by reducing line length (the respective portions of the data line are then addressed from the edge of the array); an open circuit defect in the data line then effectively isolates pixels past of the break so that they cannot be read out.

Thus, traditional array repair methods, such as using repair crossovers outside of the array area, are not effective to repair such damage. Further, in x-ray imagers, it is desirable that the data line be narrow to maximize available space for the photosensor and to reduce the capacitance between the data line and the overlying common electrode and other structures so as to reduce system noise. Arrays requiring narrow data lines are thus not well adapted to the use of a structure requiring photolithographically-formed vias (which are necessarily limited by the resolution and alignment of the photolithographic processes used in large area electronics manufacturing (e.g., flat panel displays and x-ray imagers). In such large area manufacturing techniques, the limitations of photolithographic techniques typically result in vias that cannot reliably be formed to conductive lines having widths less than in the range of about 9 μm to about 15 μm (such as vias extending between layers of conductive material in the array).

SUMMARY OF THE INVENTION

In accordance with this invention an imager array data line repair structure is provided for use in high performance imager arrays and that is adapted to be used even at a late point in array fabrication, such as after the data line has been sandwiched between underlying and overlying layers of the array. Such a repair structure is further readily fabricated without the necessity of additional patterning steps beyond what is already required for formation of the array.

A solid state imager device in accordance with this invention includes a first and a second plurality of address lines that are disposed in respective layers with an intermediate layer comprising at least one insulative material disposed therebetween. The imager device further comprises at least one integral address line repair segment that is disposed in the same layer as the first address lines and that is electrically isolated from the first address lines; the integral address line repair segment is disposed so as to underlie a repair portion of the second address line, with the intermediate layer disposed therebetween, and has a width substantially the same as the overlying second address line. Typically each second address line comprises a respective repair portion corresponding to each pixel in the imager array to which the second address line is coupled. In initial fabrication, the integral address line repair segment is electrically isolated from the overlying repair portion of the second address line; in the event a repair has been effected, the repair portion of second address line is electrically coupled to the underlying integral address line repair segment through laser welds.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
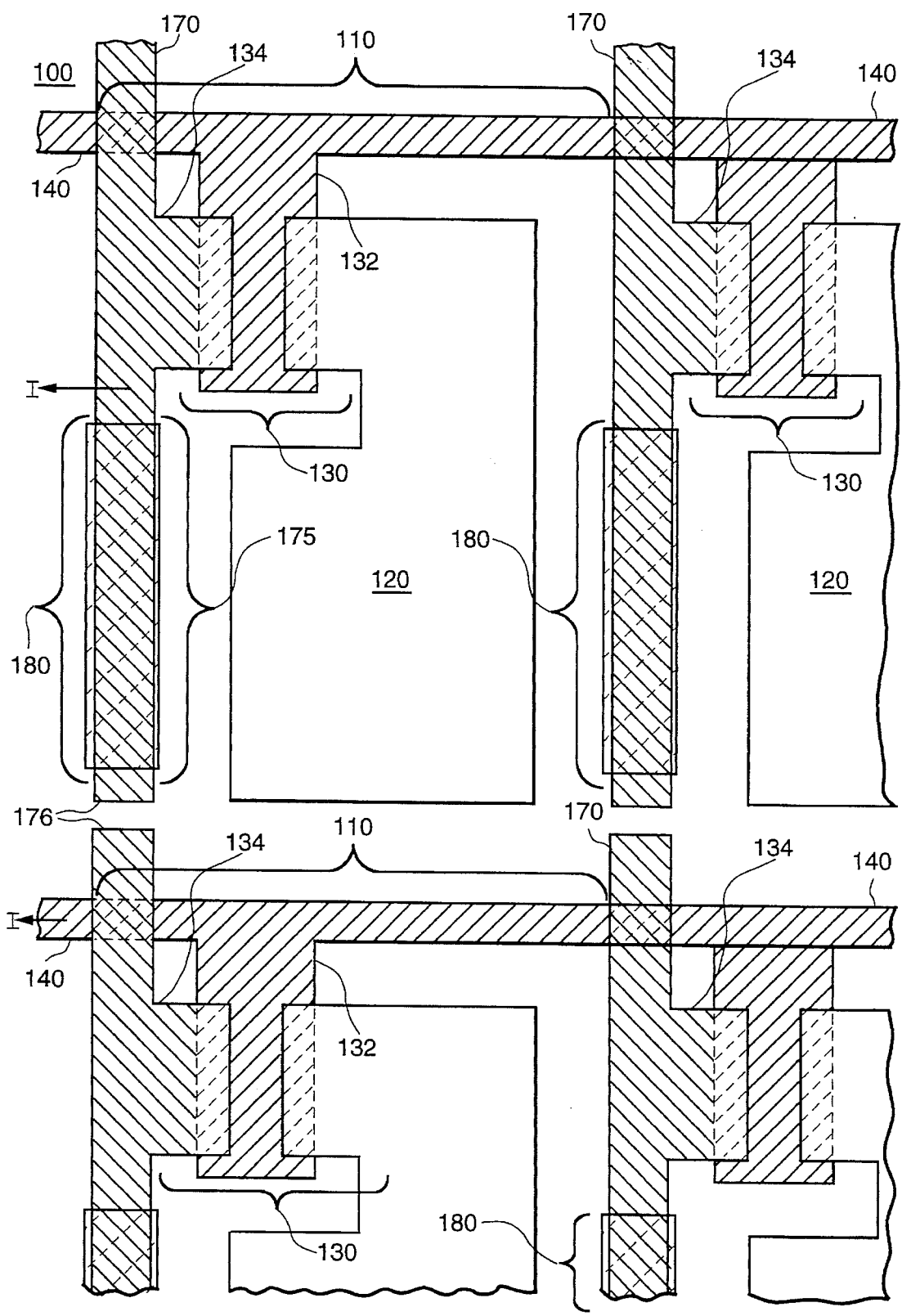
FIG. 1(A) is a plan view of a portion of an imager array having an integral address line repair segment in accordance with this invention.

An imager 100, such as a radiation imager for detecting electromagnetic radiation such as x-rays or the like, comprises a plurality of pixels 110 and a plurality of first address lines 140 and a plurality of second address lines 170 that are coupled to respective ones of pixels 110, as illustrated in FIG. 1(A). In a typical imager, each pixel 110 comprises a respective photosensor 120 and a switching transistor 130, such as a thin film transistor (TFT) or the like. In radiation imager 100, first address lines 140 typically are referred to as scan lines and are coupled to a gate 132 of TFT 130; signals on these lines are used to cause the TFT to become conductive or non-conductive. Second address lines 170 are typically referred to as data lines, and are coupled to respective drains 134 of TFTs 130; the source of TFT 130 is coupled to photosensor 120 (as used herein for TFT 130, both the source and drain of the transistor are used for electrical coupling and the specific nomenclature of source and drain is interchangeable). A semiconductive layer (not shown), comprising, e.g., amorphous silicon or the like, is further disposed in each TFT and may further be disposed under data lines 170. In accordance with this invention, imager 100 further comprises an integral address line repair segment 180 that is disposed so as to underlie a repair portion 175 of data line 170; typically a respective integral address line repair segment 180 is disposed under data line 170 for each pixel in the array.

Figure 1B:
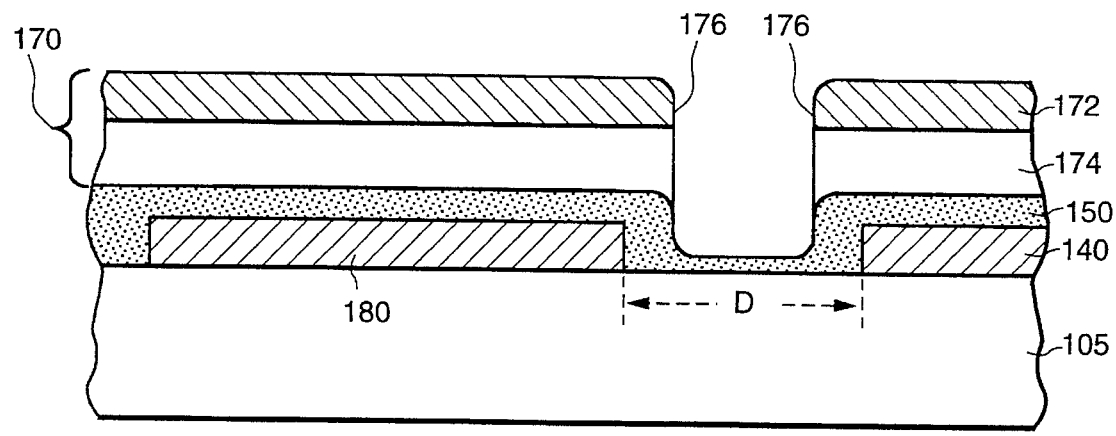
FIG. 1(B) is a cross sectional view of a portion of the imager of FIG. 1(A) taken along line I—I of that Figure.
Figure 2:
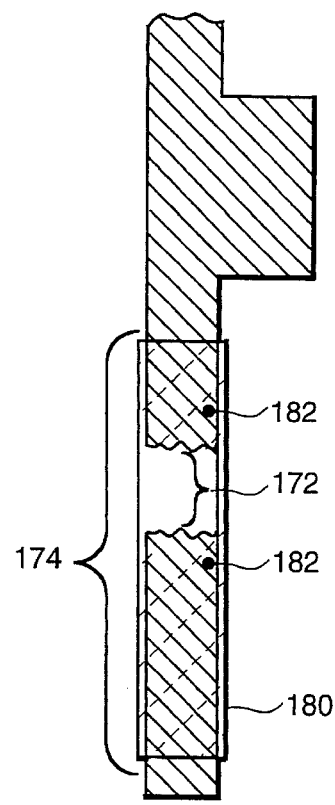
FIG. 2 is a detail view of a portion of the presentation of FIG. 1(A) illustrating an integral address line repair segment coupled to a repair portion of an overlying address line having a defect therein.

Scan lines 140 are typically disposed on a substrate 105 that comprises an optically transmissive material such as glass or the like, as illustrated in FIG. 1(B). Integral address line repair segments 180 are similarly disposed on substrate 105 but are electrically isolated from scan lines 140. Typically scan lines 140 and integral address line repair segments are separated from one another by a setoff distance "D" of at least about 5 μm so as to reduce capacitive coupling therebetween and reduce the possibility of electrical shorts therebetween. In the fabrication process, scan lines 140 and integral address line repair segments are formed as a part of the same step by the deposition of conductive material (such as molybdenum, chromium, titanium, or the like) and patterning that material (e.g., by photolithographic means) to provide the desired arrangement of conductive material on substrate 105. In accordance with this invention, integral address line repair segments are typically formed in the same process, without additional steps in the fabrication process (the only modification necessary is adjustment of the pattern of the photolithographic etching of the conductive material forming scan lines 140); the structure of the present invention is thus readily implemented in current fabrication methodologies. Scan lines 140 typically have a thickness in the range between about 0.1 μm and 1 μm and have a width in the range between about 5 μm and 15 μm. Integral address line repair segments similarly have a thickness in the same range as scan lines 140.

An intermediate layer 150 is disposed over scan lines 140 and the respective integral address line repair segments 180. The words "over", "above", "upper" and the like are used herein for convenience to refer to the relative position of layers or components with respect to substrate 105 and do not imply a particular orientation of imager array 100. Intermediate layer comprises at least one insulative material, for example an inorganic material such as silicon nitride or silicon oxide, an organic material such as polyimide or the like, or combinations thereof. The dielectric material in intermediate layer 150 is disposed to provide the gate dielectric layer in TFTs 130 and further is disposed to electrically isolate integral address line repair segments from scan lines 140 and semiconductive and conductive materials in array components disposed over repair segments 180. The thickness of intermediate layer 150 in the vicinity of repair segments 180 is in the range between about 0.1 μm and 1 μm. Additionally, TFT semiconductive material such as silicon (not shown) can further be disposed across the array between scan lines 140 and data lines 170.

Data lines 170 comprise a layer of conductive material 172 such as molybdenum, chromium, aluminum, or the like, that has a thickness in the range of about 0.1 μm and 1 μm. In one embodiment of the present invention, data lines 170 further have a layer of semiconductive material 174, such as amorphous silicon, disposed under conductive material 172. Such semiconductive material is commonly deposited on the array in the course of fabrication of TFTs 130 and, after patterning to form the transistor, can be left in the regions for data lines so as to provide a foundation for conductive material layer 172 of data lines 170. Further, the semiconductive material serves to vertically separate data line conductive layer 172 from scan lines 140 to reduce capacitive coupling therebetween by reducing likely reduction in thickness of dielectric layer 150 during fabrication processing. Data lines 170 desirably have a narrow width, that is, a width in the range between 5 μm and 15 μm so as to maximize the array space available for the active (photosensing) areas of photosensors 120 and to reduce capacitance-induced noise in the imager system. Commonly both semiconductive layer 174 and conductive layer 172 of data line 170 have substantially the same width (e.g., the same width within about 2 μm, such as 1 μm on either side of the data line conductive material). Other materials (not shown in the Figures) are typically disposed over data line 170 during the imager array fabrication process, such that data line 170 is sandwiched between the underlying scan lines and intermediate insulative layers (and TFT semiconductive material layers) and overlying semiconductive, insulative, and conductive layers (such as TFT dielectric coatings and the photosensor common electrode layer). As a consequence, any defect in data line 170 is difficult to access for repair once imager array 100 has been fabricated.

In high performance imagers (e.g., imagers of a size of about 10 cm by 10 cm or more and requiring low noise performance), data lines 170 are typically severed near the midpoint of the array at a termination point 176, such that the data line is necessarily addressed from contacts on opposite sides of the array. Cutting the data line around the midpoint of the array serves to reduce data line capacitance, thus reducing the noise in the array signals, which is critical to the effective functioning of the imager for medical imaging purposes.

Integral address line repair segments underlie repair portion 175 of data lines 170; the size of repair portion 175 is determined by the size of underlying repair segment 180, the size of which in turn is determined by maintain an adequate setoff distance (e.g., about 5 μm) from the nearest portion of scan lines 140. Repair segments 180 typically have a width that corresponds to the width of data line 170; if semiconductive layer 174 and conductive layer 172 of data line 170 have different widths, underlying repair segment 180 desirably has a width that corresponds (e.g., is substantially the same as (e.g., within 2 μm) of the widest portion of data line 170.

During fabrication and after completion of fabrication of imager 100, tests are run to determine the electrical integrity of scan lines 140 and data lines 170 and the couplings between these components and TFTs 130 and photosensors 120. An open circuit defect 177 (FIG. 3) in data line 170, particularly one having a termination point 176 near the midpoint of the array, is desirably repaired in order to be able to have access to the maximum number of pixels in the array. With the structure of the imager of the present invention, an open circuit defect in the repair portion of data line 170 is readily repaired. Repair portions 175 adjacent to termination points 176 are shown in FIG. 1 for purposes of illustration. Respective repair portions 175 disposed in pixels closer to the edge of the array provide the means for repairing defects in the conductive material of the data lines so as to maintain data line contact to all pixels between termination point 176 and the edge of the array.

The various repair portions 175 on a data line 170 typically would comprise about 50% of the total length of the data line, but alternatively may be as little as about 25% or as much as about 75% of the line length, depending on pixel pitch. A laser weld 182 (FIG. 3) is disposed between data line 170 and integral address line repair segment 180 (shown as the cross-hatched region in FIGS. 1(A) and FIG. 3) on each side of defect 177. The laser weld comprises a fusion of the conductive materials of repair segment 180 and the overlying data line portion such that the intermediate layer 150 insulative material is displaced so that a low-resistance (e.g., 50 Ω, which is a small fraction of line resistance, which is on the order of several kΩ or more) contact is made between the repair segment and the data line. The laser weld is typically made by applying laser light of a selected frequency and intensity to the underside of substrate 105 so that the light passes through the optically transmissive glass of the substrate and is incident on the desired area of repairs segment 180 so as to cause melting of the material of the repair segment and the overlying data line to form the laser weld. The laser energy is applied in a highly localized area so that the size of the laser weld is quite small (e.g., a diameter in the range of between about 5 µm and 10 µm). The application of the laser energy from the underside of substrate 105 further enables the repair to be effected without disturbing the upper portion (not shown) of the imager structure (e.g., the common electrode and TFT dielectric layers) that is coated and sealed in the fabrication process The laser weld thus provides both a small size connection (well suited for narrow address lines) an also precise alignment with the address lines, which is an improvement in flexibility and reliability over when vias are formed photolithographically, which involves both the limitations of via size and also alignment on the array. The laser weld can be formed only in those lines requiring repair, and after fabrication of the device; photolithograpically formed vias for linkage of two layer address line components must be done during fabrication and for each line, whether required or not, a practice that increased the likelihood of array defects resulting from the via formation processes.

The present invention thus provides a repair structure that enables quick and readily accomplished repairs of a data line open circuit, and provides a repair structure that is robust when the repair connection is made between the defective data line and the underlying repair segment. Further, because in the unrepaired structure intermediate level 150 is disposed between the data line and the repair segment, the structural integrity of the imager device is enhanced (due to the lack of built in vias to connect the to components as a matter of course), which also provides better protection over time against moisture penetration of the array.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A solid state imager device having a plurality of pixels disposed on a substrate, the imager device comprising:

a plurality of first address lines disposed in a first layer of said imager device, said first address lines comprising conductive material and being coupled to respective ones of said pixels;

a plurality of second conductive address lines disposed in a second layer of said imager device, respective ones of said first and second address lines being disposed substantially perpendicular to one another, said second address lines further being coupled to respective ones of said pixels;

an intermediate layer disposed between said respective pluralities of said first and second address lines, said intermediate layer comprising at least one insulative material layer; and at least one integral address line repair segment, said integral address line repair segment comprising the same conductive material comprising said first address lines, said at least one integral address line repair segment being disposed in said first layer so as to underlie a repair portion of one of said second address lines with said intermediate layer disposed therebetween, said integral address line repair segment being electrically isolated from said first address lines and having a width substantially the same as the width of said overlying second address line.

2. The imager of claim 1 wherein each of said integral address line repair segments is disposed such that the distance between each of said integral address line repair segments and said first address lines is at least 5 µm.

3. The imager of claim 2 wherein the each of said second address lines has a width in the range between about 5 µm and 15 µm.

4. The imager of claim 3 wherein, for each pixel in said imager, at least one integral address line repair segment is disposed to underlie the respective repair portion of said second address line coupled to said pixel.

5. The imager of claim 4 wherein each of said pixels comprises a thin film transistor (TFT) and a photosensor, said first address line coupled to said pixel comprising a scan line coupled to the gate of said TFT, said second address line coupled to said pixel comprising a data line coupled to the source of said TFT, said photosensor being coupled to the drain of said TFT.

6. The imager of claim 5 wherein said imager comprises an x-ray imager, and at least one of said second address lines is severed at the midpoint of the array.

7. The imager of claim 1 wherein said substrate comprises an optically transmissive material and said integral repair line segments are disposed over one surface of said substrate such that light can pass from the opposite surface of said substrate through said substrate and be incident on respective ones of said integral repair line segments.

8. The imager of claim 1 wherein each of said integral repair line segments are electrically isolated from said second address lines.

9. The imager of claim 1 wherein at least one of said integral repair line segments is electrically coupled to an overlying repair segment of one of said second address lines, each of the electrical couplings comprising a laser weld.

10. The imager of claim 9 wherein the diameter of each of said laser welds is in the range between about 5 µm and 10 µm.

11. The imager of claim 1 wherein said second address line comprises a layer of conductive material and a layer of semiconductive material.

12. The imager of claim 11 wherein said semiconductive material disposed in said second address line comprises amorphous silicon.

13. The imager of claim 1 wherein said insulative material disposed in said intermediate layer is selected from the group consisting of silicon nitride, silicon oxide, and polyimides.

* * * * *